(12) United States Patent
Nishioka et al.

(10) Patent No.: US 10,368,438 B2
(45) Date of Patent: Jul. 30, 2019

(54) PRINTED WIRING BOARD AND METHOD FOR MANUFACTURING THE SAME

(71) Applicant: IBIDEN CO., LTD., Ogaki (JP)

(72) Inventors: Hiroyuki Nishioka, Ogaki (JP); Shinsuke Ishikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/487,560

(22) Filed: Apr. 14, 2017

(65) Prior Publication Data

US 2017/0303396 A1    Oct. 19, 2017

(30) Foreign Application Priority Data

Apr. 14, 2016 (JP) ................ 2016-081440

(51) Int. Cl.
*H05K 1/11* (2006.01)
*H05K 1/03* (2006.01)
(Continued)

(52) U.S. Cl.
CPC ............ *H05K 1/113* (2013.01); *G03F 7/028* (2013.01); *G03F 7/031* (2013.01); *G03F 7/038* (2013.01); *G03F 7/039* (2013.01); *G03F 7/094* (2013.01); *G03F 7/095* (2013.01); *G03F 7/16* (2013.01); *G03F 7/168* (2013.01); *G03F 7/2004* (2013.01);
(Continued)

(58) Field of Classification Search
CPC ...... H05K 1/113; H05K 1/0313; H05K 3/282; H05K 3/0055; H05K 2203/0776; G03F 7/094; G03F 7/16; G03F 7/40; G03F 7/2004; G03F 7/031; G03F 7/038; G03F 7/168; G03F 7/32; G03F 7/039
See application file for complete search history.

(56) References Cited

U.S. PATENT DOCUMENTS 5,313,021 A * 5/1994 Sajja ................ H05K 3/3421
174/258
5,912,106 A * 6/1999 Chang ................ G03F 7/027
430/281.1
(Continued)

FOREIGN PATENT DOCUMENTS

JP    2001-019865 A    1/2001

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a laminated base material including an insulating layer and a conductor layer formed on the insulating layer, and a solder resist layer laminated on the laminated material and including photosensitive resin. The resist layer has surface portion and portion in contact with the laminated material, the conductor layer has pattern including conductor pads in contact with the resist layer such that the pads are positioned in openings in the resist layer, and the resist layer satisfies a first condition that a chemical species derived from a photopolymerization initiator has concentration higher in the portion in contact with the laminated material than concentration in the surface portion and/or a second condition that the chemical species derived from the initiator in the portion in contact with the laminated material has photopolymerization initiating ability higher than a chemical species derived from a photopolymerization initiator in the surface portion.

20 Claims, 3 Drawing Sheets

(51) Int. Cl.
*H05K 3/34* (2006.01)
*G03F 7/031* (2006.01)
*G03F 7/038* (2006.01)
*G03F 7/039* (2006.01)
*G03F 7/09* (2006.01)
*G03F 7/16* (2006.01)
*G03F 7/20* (2006.01)
*G03F 7/32* (2006.01)
*G03F 7/40* (2006.01)
*H05K 3/00* (2006.01)
*H05K 3/28* (2006.01)
*G03F 7/028* (2006.01)
*G03F 7/095* (2006.01)

(52) U.S. Cl.
CPC ............... *G03F 7/32* (2013.01); *G03F 7/40* (2013.01); *H05K 1/0313* (2013.01); *H05K 1/111* (2013.01); *H05K 1/112* (2013.01); *H05K 3/0055* (2013.01); *H05K 3/282* (2013.01); *H05K 3/3452* (2013.01); *H05K 3/287* (2013.01); *H05K 2201/0195* (2013.01); *H05K 2201/0269* (2013.01); *H05K 2203/0776* (2013.01)

(56) References Cited

U.S. PATENT DOCUMENTS

| 6,787,918 | B1* | 9/2004 | Tsai | H01L 21/563 257/738 |
| 7,575,851 | B2* | 8/2009 | Shiba | C08G 59/18 430/18 |
| 8,460,853 | B2* | 6/2013 | Ajioka | C08F 2/50 430/270.1 |
| 8,471,154 | B1* | 6/2013 | Yoshida | H01L 23/3128 174/260 |
| 9,310,680 | B2* | 4/2016 | Ito | G03F 7/038 |
| 2014/0147776 | A1* | 5/2014 | Ito | G03F 7/038 430/18 |

* cited by examiner

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2016-081440, filed Apr. 14, 2016, the entire contents of which are incorporated herein by reference.

BACKGROUND OF THE INVENTION

Field of the Invention

The present invention relates to a printed wiring board and a method for manufacturing the printed wiring board.

Description of Background Art

Japanese Patent Laid-Open Publication No. 2001-19865 describes that a solder resist resin composition is applied, a photomask is brought into contact with the solder resist resin composition layer, exposure is performed by irradiating ultraviolet light to the solder resist resin composition layer, and a liquid developer is used to form the openings, and a heat treatment is further performed, and thereby a solder resist layer having openings for solder pads is formed. The entire contents of this publication are incorporated herein by reference.

SUMMARY OF THE INVENTION

According to one aspect of the present invention, a printed wiring board includes a laminated base material including an insulating layer and a pad conductor layer formed on the insulating layer, and a solder resist layer laminated on a surface of the laminated base material and including a photosensitive resin material. The solder resist layer has a surface portion and a portion in contact with the laminated base material on the opposite side with respect to the surface portion, the pad conductor layer of the laminated base material has a pattern including conductor pads in contact with the solder resist layer such that the conductor pads are positioned in opening portions formed in the solder resist layer, respectively, and the solder resist layer satisfies one or more of a first condition that a chemical species derived from a photopolymerization initiator has a concentration that is higher in the portion in contact with the laminated base material than a concentration in the surface portion and a second condition that the chemical species derived from the photopolymerization initiator in the portion in contact with the laminated base material has photopolymerization initiating ability higher than a chemical species derived from a photopolymerization initiator in the surface portion.

According to another aspect of the present invention, a method for manufacturing a printed wiring board includes forming, on a surface of a laminated base material including a pad conductor layer, solder resist precursor layers such that the solder resist precursor layers include a first solder resist precursor layer formed on the surface of the laminated base material and including a first resin composition including a photosensitive resin material and a photopolymerization initiator and that the solder resist precursor layers includes a k-th solder resist precursor layer formed on a (k−1)-th solder resist precursor layer and including a k-th resin composition including a photosensitive resin material and a photopolymerization initiator, where k=2 to n, and n is an integer equal to or greater than 2, irradiating light upon the solder resist precursor layers except for regions corresponding to opening portions such that the solder resist precursor layers from the first solder resist precursor layer to the n-th solder resist precursor layer are cured, and developing the solder resist precursor layers with a liquid developer such that a solder resist layer having the opening portions exposing conductor pads of the pad conductor layer is formed. The solder resist precursor layers are formed such that a photocuring ability of the (k−1)-th resin composition is same as or higher than a photocuring ability of the k-th resin composition and that a photocuring ability of the first resin composition is higher than a photocuring ability of the n-th resin composition, and the laminated base material includes an insulating layer and the pad conductor layer formed on the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
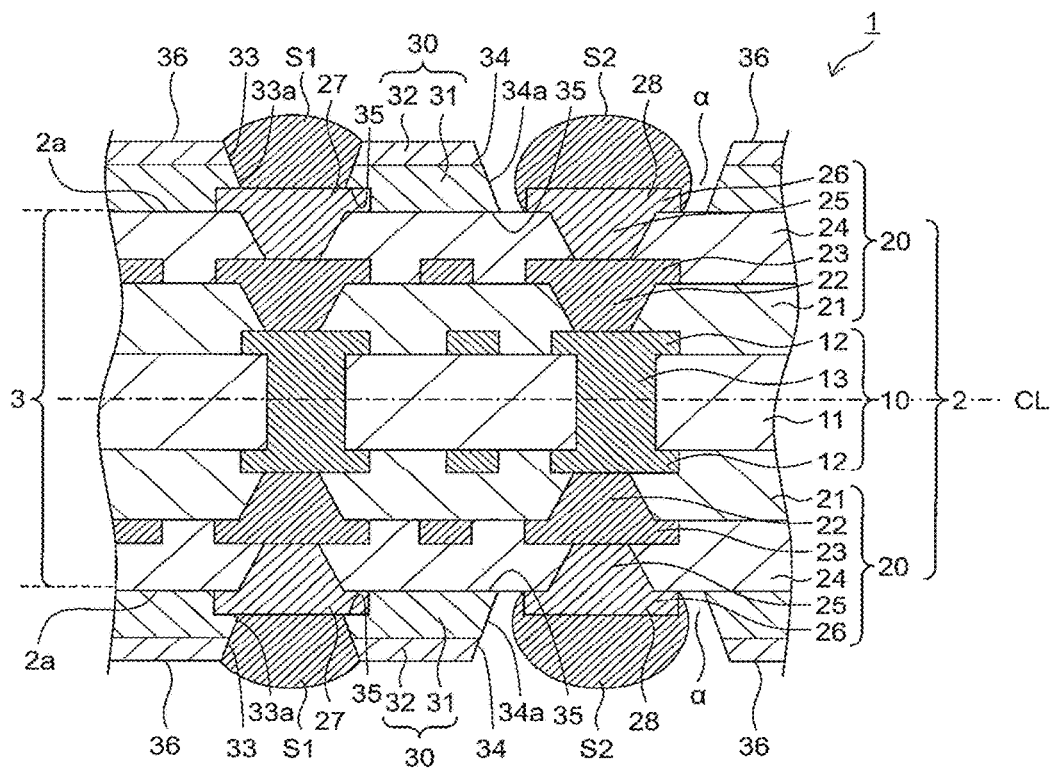
FIG. 1 is a schematic cross-sectional view of a printed wiring board 1 according to an embodiment of the present invention.

The embodiments will now be described with reference to the accompanying drawings, wherein like reference numerals designate corresponding or identical elements throughout the various drawings.

A printed wiring board 1 according to an embodiment of the present invention is structured as illustrated in the schematic cross-sectional view of FIG. 1.

The printed wiring board 1 includes one or more laminated conductor layers and one or more laminated insulating layers. Specifically, the printed wiring board 1 includes a core layer 10, build-up layers 20, and solder resist layers 30. The printed wiring board 1 is a package substrate, on which a semiconductor element such as an IC chip can be mounted by flip chip connection, and can be mounted on another printed wiring board such as a motherboard after the semiconductor element is mounted. The printed wiring board 1 of the present embodiment is a multilayer laminated printed wiring board, and as a whole has a plate-like or film-like shape. Further, although not illustrated in the drawings, it is obvious that the present embodiment is also applicable to a coreless printed board that does not include the core layer 10.

In the present embodiment, the printed wiring board 1 has a structure that is vertically symmetrical about a central axis (CL) of a core insulating layer 11. Therefore, in the following description, only one side of the central axis (CL) is described. In the present embodiment, the printed wiring board 1 has the structure that is vertically symmetrical about the central axis (CL). However, in accordance with a structure of an intended circuit, the printed wiring board 1 may also have an asymmetric structure. The structure of the printed wiring board 1 is not limited.

The core layer 10 includes the core insulating layer 11, and first conductor layers 12 that are respectively formed on two main surfaces of the core insulating layer 11. Further, filled through holes 13 that electrically connect between the first conductor layers 12 that are respectively formed on the two main surfaces of the core insulating layer 11 are provided in the core layer 10.

The build-up layers 20 are respectively laminated on both sides of the core layer 10. The build-up layers 20 are each formed by laminating one or more conductor layers and one or more insulating layers and, specifically, each have, for example, the following structure.

A first insulating layer 21 covers the first conductor layer 12 of the core layer 10. A second conductor layer 23 is formed on a surface of the first insulating layer 21 on a side where the first conductor layer 12 is not formed. First conductor vias 22 that penetrate the first insulating layer 21 and electrically connect the first conductor layer 12 and the second conductor layer 23 are formed in the first insulating layer 21. The second conductor layer 23 is further covered by a second insulating layer 24.

A third conductor layer 26 is formed on a surface of the second insulating layer 24 on a side where the second conductor layer 23 is not formed. Second conductor vias 25 that penetrate the second insulating layer 24 and electrically connect the second conductor layer 23 and the third conductor layer 26 are formed in the second insulating layer 24.

The third conductor layer 26 is a conductor layer positioned as an outermost layer among the conductor layers and includes at least multiple conductor pads (27, 28) that are connected to substrate mounting parts (not illustrated in the drawings), and, although not illustrated in the drawings, may further include other wiring patterns. The third conductor layer 26 includes the multiple conductor pads (27, 28) and thus can be referred to as a "pad conductor layer." The build-up layer 20 may include more insulating layers and/or conductor layers, and the conductor layers may be connected via more conductor vias.

The solder resist layer 30 is an outermost layer of the printed wiring board 1 and is provided so as to cover the third conductor layer 26 of the build-up layer 20. The solder resist layer 30 is an insulating layer that is positioned as an outermost layer among the insulating layers included in the printed wiring board 1. Multiple openings (33, 34) are provided in the solder resist layer 30. The conductor pads (27, 28) of the third conductor layer 26 are positioned so as to be respectively exposed in the openings (33, 34).

The conductor pad 27 is formed so as to extend into an edge of the opening 33 (specifically, a laminated base material vicinity portion (33*a*) of the opening 33). The conductor pad 27 formed in this way is referred to as an SMD (Solder Mask Defined) pad. On the other hand, in the opening 34, the conductor pad 28 is formed such that a gap ($\alpha$) is formed between the conductor pad 28 and an edge of the opening 34 (specifically, a laminated base material vicinity portion (34*a*) of the opening 34). The conductor pad 28 formed in this way is referred to as an NSMD (Non Solder Mask Defined) pad. In the present specification, when it is necessary to distinguish between the SMD pad and the NSMD pad, the conductor pad 27, the conductor pad 28, the opening 33 and the opening 34 are respectively referred to as the SMD pad 27, the NSMD pad 28, the SMD opening 33 and the NSMD opening 34.

Solder bumps (S1, S2) are respectively provided on the conductor pads (27, 28) in the openings (33, 34).

A portion of the printed wiring board 1 excluding the solder resist layers 30, that is, a portion including the core layer 10 and the build-up layers 20 that are respectively formed on both sides of the core layer 10, is referred to as a laminated base material 2. Further, a portion of the laminated base material 2 excluding the third conductor layers (pad conductor layers) 26, which are the outermost layers, is referred to as a laminate main body 3. The laminate main body 3 includes the laminated conductor layers and insulating layers. The laminated base material 2 includes the laminate main body 3, and a conductor layer (the third conductor layer 26) including one or more pads (27, 28) formed on at least one of main surfaces of the laminate main body 3. Among the insulating layers included in the printed wiring board 1, the insulating layers (the first insulating layer 21 and the second insulating layer 24) included in the laminate main body 3 may each be referred to as an "interlayer insulating layer," and the solder resist layer 30 may be referred to as a "protective insulating layer."

The interlayer insulating layers can each be formed of an insulating composition such as a thermosetting resin composition or a photosensitive resin composition. These insulating compositions may each contain inorganic filler, and the content of the inorganic filler is, for example, 30-80 mass %.

The conductor layers (the first conductor layer 12, the second conductor layer 23, and the third conductor layer 26) are each depicted as a single layer in FIG. 1. However, the conductor layers may each be formed by laminating multiple conductor layers. For example, the conductor layers can each have a multilayer structure in which a seed layer and an electrolytic plating layer are sequentially laminated. A seed layer is a base layer for forming an electrolytic plating layer on a surface of each of the interlayer insulating layers and the core insulating layer 11, specifically, an electroless plating layer, a metal layer formed by sputtering, or the like. As a conductor that forms the conductor layers, for example, copper can be used.

In the following, characteristics of the printed wiring board 1 of the present embodiment are described focusing on the solder resist layer 30.

In the present embodiment, the solder resist layer 30 has a structure in which a first solder resist layer 31 and a second solder resist layer 32 are sequentially laminated on a surface of the laminated base material 2. In the present embodiment, the solder resist layer 30 includes two layers. However, the present invention is not limited to this. It is also possible that the solder resist layer 30 includes three or more layers. When the number of layers included in the solder resist layer 30 and in a later-described solder resist precursor layer 40 is n, n is an integer equal to or greater than 2. A boundary between the first solder resist layer 31 and the second solder resist layer (and a boundary between a first solder resist precursor layer 41 and a second solder resist precursor layer 42 to be described later) is expressed as a clear boundary in FIGS. 1, 4 and 5 for convenience of description. However, the present invention is not limited to this. It is also possible that the boundary is a fuzzy boundary in which a composition continuously changes between the first solder resist layer 31 and the second solder resist layer (and between the first solder resist precursor layer 41 and the second solder resist precursor layer 42).

Method for Manufacturing Printed Wiring Board

An example of a method for manufacturing the wiring board 1 of the present embodiment is described with reference to FIG. 2-5.

Figure 2:
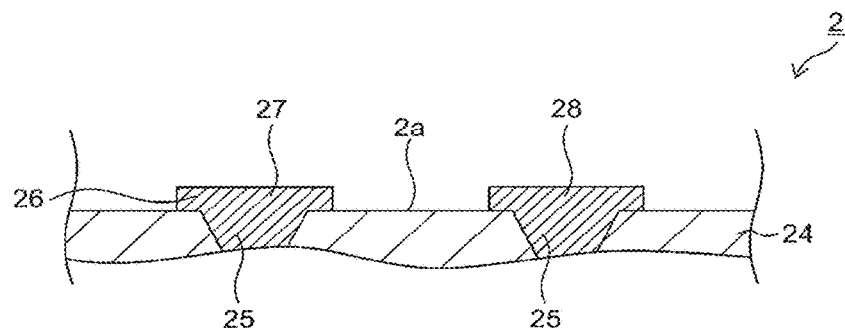
FIG. 2 is a schematic cross-sectional view near a surface of a laminated base material 2.

Preparation Process (FIG. 2)

In the present embodiment, as a starting material, the laminated base material 2 illustrated in FIG. 2 is used. Details of the laminated base material 2 are as described above with reference to FIG. 1. A method for forming the laminated base material 2 is not particularly limited.

Figure 3:
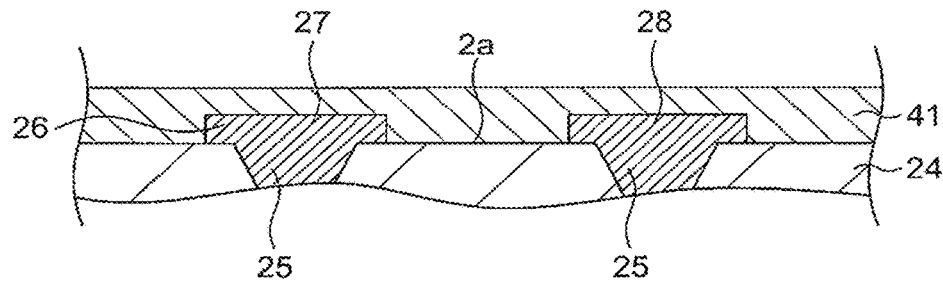
FIG. 3 is a schematic cross-sectional view for describing a first solder resist precursor layer formation process in an embodiment of a method for manufacturing a printed wiring board according to an embodiment of the present invention.

First Solder Resist Precursor Layer Formation process and Second Solder Resist Precursor Layer Formation Process Next, as illustrated in FIG. 3, a first solder resist precursor layer formation process is performed in which, on a surface (2a) of the laminated base material 2 where the pad conductor layer 26 is formed, the first solder resist precursor layer 41 composed of a first resin composition that contains a photosensitive resin and a photopolymerization initiator is formed.

Figure 4:
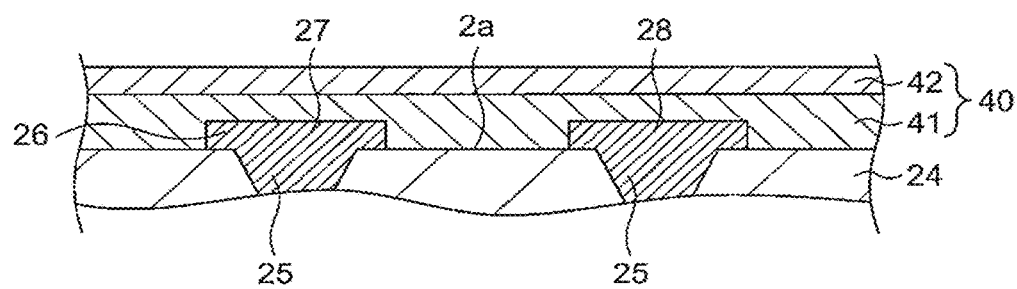
FIG. 4 is a schematic cross-sectional view for describing a second solder resist precursor layer formation process (k-th solder resist precursor layer formation process) in the method for manufacturing the printed wiring board according to the embodiment of the present invention.

Subsequently, as illustrated in FIG. 4, a second solder resist precursor layer formation process is performed in which, on the first solder resist precursor layer 41, the second solder resist precursor layer 42 composed of a second resin composition that contains a photosensitive resin and a photopolymerization initiator is formed.

The solder resist precursor layer 40 is formed by all of the layers from the first solder resist precursor layer 41 to the second solder resist precursor layer 42.

As described above, the solder resist precursor layer 40 may include three or more layers. That is, the second solder resist precursor layer formation process can be generalized to a k-th solder resist precursor layer formation process in which, after the first solder resist precursor layer formation process, a process in which, on a (k−1)-th solder resist precursor layer, a k-th solder resist precursor layer composed of a k-th resin composition that includes a photosensitive resin and a photopolymerization initiator is formed, is performed from k=2 to k=n (where n is an integer equal to or greater than 2).

The resin compositions that respectively form the solder resist precursor layers are photosensitive resin compositions that each include at least a photosensitive resin and a photopolymerization initiator. The resin compositions that respectively form the solder resist precursor layers are described in detail in the following.

Here, a photosensitive resin is also referred to as a photosensitive polymer, a photopolymer, or the like. A photosensitive resin is a polymer compound of which a physical property changes as a result of a photochemical reaction, and is typically a polymer compound that is cured by light irradiation in the presence of a photopolymerization initiator. A representative example of a photosensitive resin is a polymer compound having a radical polymerizable double bond. A photosensitive resin, for example, is a polymer compound that contains, in a side chain, a (meth) acryloyl group derived from at least one (referred to as a "(meth)acrylic acid") selected from an acrylic acid and a methacrylic acid. Specifically, an example of a photosensitive resin is a photosensitive resin obtained by (meth) acrylating a thermosetting group of a thermosetting resin having the thermosetting group. An example of the thermosetting resin having a thermosetting group is an epoxy resin having an epoxy group, which is a thermosetting group. Examples of the epoxy resin include a novolak type epoxy resin such as a phenol novolak type epoxy resin or an alkylphenol novolak type epoxy resin (such as a cresol novolak type epoxy resin), and an alicyclic epoxy resin, and the like. In particular, a novolac type epoxy resin is preferable. As a (meth)acrylate of an epoxy resin, in particular, a (meth)acrylate of an epoxy resin that has two or more epoxy groups remaining in one molecule and has both thermosetting and photosensitive properties is preferable. It is also possible that two or more photosensitive resins are used in combination.

A photopolymerization initiator is a compound capable of absorbing light to provide radical active species. Representative examples of photopolymerization initiators include aromatic ketones. Examples of photopolymerization initiators of aromatic ketones include alkylphenone derivatives and benzophenone derivatives. Examples of alkylphenone derivatives include benzyl dimethyl ketal, α-hydroxy alkyl phenone, and α-amino alkyl phenone. An example of the benzyl dimethyl ketal is 2,2-dimethoxy-1,2-diphenylethan-1-one. Examples of the α-hydroxy alkyl phenone include 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, and 2-hydroxy-1-{4-[4-(2-hydroxy-2-methyl-propionyl)-benzyl] phenyl}-2-methyl-propan-1-one. Examples of the α-amino alkyl phenone include 2-methyl-1-(4-methylthiophenyl)-2-morpholinopropane-1-one, 2-benzyl-2-dimethylamino-1-(4-morpholinophenyl)-butanone-1, and 2-(dimethylamino)-2-[(4-methylphenyl) methyl]-1-[4-(4-morpholinyl) phenyl]-1-butanone. An example of the benzophenone derivative is benzophenone. It is also possible that two or more photopolymerization initiators are used in combination.

The resin compositions may each further contain other components. Examples of the other components that can be contained in the resin compositions include a polymerization inhibitor, a photosensitizer, a thermosetting resin, an epoxy resin curing agent, an inorganic filler, and the like.

A polymerization inhibitor has an effect of suppressing a photocuring ability of a resin composition. A polymerization inhibitor is not particularly limited as long as the polymerization inhibitor can stop a photochemical reaction of a photosensitive resin by supplementing radicals to form stable radicals. However, typically, examples of polymerization inhibitors include hydroquinone or hydroquinone derivatives. As the hydroquinone derivatives, hydroquinone monomethyl ether, benzoquinone and the like are preferable. It is also possible that two or more polymerization inhibitors are used in combination.

A photo sensitizer can be suitably selected according to a wavelength of light to irradiated, a photopolymerization initiator, and the like. Examples of photosensitizers include Michler's ketone, thioxanthone-based photosensitizers, and the like. It is also possible that two or more photosensitizers are used in combination.

Specific examples of thermosetting resins include an epoxy resin, a phenol resin, a polyimide resin, a polyester resin, a bismaleimide resin, a polyolefin-based resin, a polyphenylene ether resin, and the like. It is also possible that two or more thermosetting resins are used in combination.

Examples of the epoxy resin include a bisphenol A type epoxy resin, a bisphenol F type epoxy resin, a novolac type epoxy resins such as a phenol novolac type epoxy resin or an alkylphenol novolac type epoxy resin (such as a cresol novolak type epoxy resin), an alicyclic epoxy resin, a biphenyl type epoxy resin, a naphthalene type epoxy resin, a dicyclopentadiene type epoxy resin, an epoxy compound of a condensate of a phenol and an aromatic aldehyde having a phenolic hydroxyl group, triglydisyl isocyanurate, and the like. It is also possible that two or more epoxy resins are used in combination.

An epoxy resin curing agent is used in combination when an epoxy resin is used as a thermosetting resin. An epoxy resin curing agent is involved in cross-link formation between epoxy groups. Examples of epoxy resin curing agents include imidazole-based curing agents, amine-based curing agents, acid anhydride-based curing agents, phenol-based curing agents, polymercaptan-based curing agents, and the like. Imidazole-based curing agents are particularly preferable. Examples of imidazole-based curing agents include 1-benzyl-2-methylimidazole, 1-cyanoethyl-2-ethyl-4-methylimidazole, 4-methyl-2-ethylimidazole, and the like. It is also possible that two or more epoxy resin curing agents are used in combination.

Examples of inorganic fillers include silica, barium sulfate, talc, and the like.

The resin compositions may each be used in a form of a fluid (liquid or paste) containing a suitable solvent. The solvent is not particularly limited. However, for example, glycol ethers can be used. Examples of glycol ethers include diethylene glycol dimethyl ether, triethylene glycol dimethyl ether, and the like. It is also possible that two or more solvents are used in combination.

As the resin compositions, a separately prepared photosensitive dry film may be used.

The resin compositions may each be independently prepared, or may each be a commercially available composition for forming a solder resist, or may each be obtained by modifying a commercially available composition for for ring a solder resist.

In the present embodiment, the solder resist precursor layer 40 is formed by multiple layers including, in an order starting from the layer closest to the laminated base material 2, the first solder resist precursor layer—the n-th solder resist precursor layer, and the photocuring ability of the (k−1)-th resin composition is the same or higher than the photocuring ability of the k-th resin composition, and the photocuring ability of the first resin composition is higher than the photocuring ability of the n-th resin composition. Here, k is an integer from 2 to n. When a layer composed of a resin composition having a predetermined thickness is formed on a substrate and the layer is exposed to light of a predetermined wavelength and is developed with a liquid developer, the photocuring ability of the resin composition can be evaluated based on a minimum required cumulative dose of irradiation light in order to cure the layer to an extent that the layer is not eluted by the liquid developer. More specifically, when the photocuring ability is compared between a resin composition (A) and a resin composition (B), which are both photosensitive resin compositions, under the same condition, when the minimum required cumulative dose of irradiation light in order to cure a layer composed of the resin composition (A) is smaller than the minimum required cumulative dose of irradiation light in order to cure a layer composed of the resin composition (B), the photocuring ability of the resin composition (A) is higher than the photocuring ability of the resin composition (B), and the photocuring ability of the resin composition (B) is lower than the photocuring ability of the resin composition (A). A person skilled in the art can easily evaluate the photocuring ability between multiple resin compositions by performing comparative tests.

As described above, as illustrated in FIG. 6, in a case where the solder resist layer 130 is formed on the surface of the laminated base material 2 from a photosensitive resin composition that is substantially uniform in composition in a thickness direction, when photocuring of the solder resist layer 130 is insufficient in a vicinity of the laminated base material 2, it is thought that, when the openings (133, 134) are formed by development using a liquid developer, the laminated base material vicinity portions (133a, 134a) are removed by the liquid developer and recesses occur as illustrated in FIG. 6. When recesses occur in the laminated base material vicinity portions (133a, 134a) of the openings (133, 134) of the solder resist layer 130, it is thought that the following disadvantage occurs.

Figure 7:
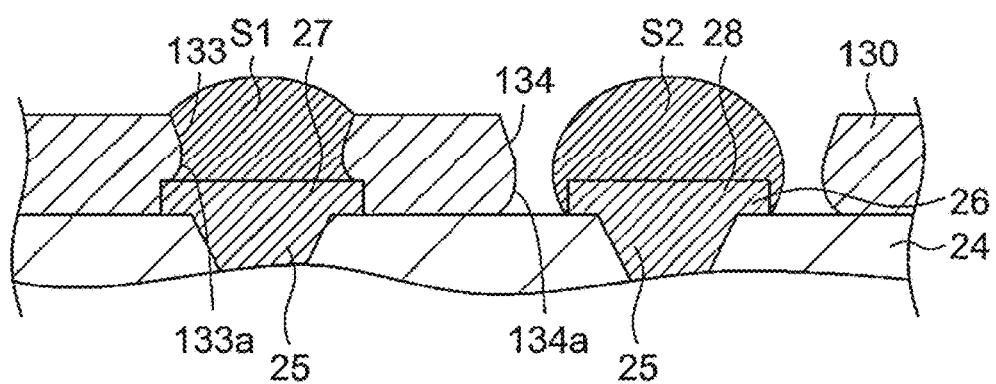
FIG. 7 is a schematic cross-sectional view (2) for describing the problem that is thought to occur in the conventional method for manufacturing a printed wiring board.

As illustrated in FIG. 7, a case is assumed where the solder bumps (S1, S2) are respectively formed on surfaces of the SMD pad 27 and the NSMD pad 28.

As illustrated in FIG. 7, the solder bump (S1) is likely to enter the recess of the laminated base material vicinity portion (133a) of the SMD opening 133 and is likely to be formed to spread in a width direction more than originally intended. Further, when the solder bump (S1) enters the recess of the laminated base material vicinity portion (133a) of the SMD opening 133, a haloing phenomenon that the solder resist layer 130 partially peels off is likely to occur. When these situations occur, there is a possibility that a short circuit between adjacent conductor pads may occur.

Further, the laminated base material vicinity portion (134a) of the NSMD openings 34 is farther from a light source than the laminated base material vicinity portion (133a) of the SMD opening 133 is, and thus, arriving light intensity is smaller and photocuring is even more insufficient, and a deeper recess is likely to be formed (see FIG. 7). Therefore, at the laminated base material vicinity portion (134a) of the NSMD openings 34, the haloing phenomenon is even more likely to occur.

In the present embodiment, in the solder resist precursor layer 40, a portion closer to the laminated base material 2 has higher photocuring ability and a portion closer to the surface has lower photocuring ability. Thereby, variation in degree of curing in the solder resist layer 30 after exposure can be suppressed and the above-described disadvantage can be eliminated.

The photocuring ability of each of the resin compositions is determined by various factors. Examples of the factors include concentration and type of a photopolymerization initiator, and concentration and type of a polymerization inhibitor, and the like.

The difference in the photocuring ability between the resin compositions is typically due to at least one of a difference between concentrations of photopolymerization initiators contained in the resin compositions and a difference between types of the photopolymerization initiators contained in the resin compositions. For example, when resin compositions having the same composition except for the concentration of a photopolymerization initiator are compared to each other, a resin composition having a higher concentration of the photopolymerization initiator usually has higher photocuring ability. Further, when resin compositions having the same composition except for the type of a photopolymerization initiator are compared to each other, a resin composition containing a photopolymerization initiator with a higher photosensitivity usually has higher photocuring ability.

It is also possible that the difference in the photocuring ability between resin compositions is further due to at least one of a difference between concentrations of polymerization inhibitors contained in the resin compositions and a difference between types of the polymerization inhibitors contained in the resin compositions. As described above, in each of the resin compositions of the present embodiment, it is possible that a polymerization inhibitor is contained or not contained. For example, when the (k−1)-th resin composition (for example, the first resin composition) and the k-th resin composition (for example, the second resin composition) are compared to each other, when the (k−1)-th resin composition does not contain a polymerization inhibitor and only the k-th resin composition contains a polymerization inhibitor, the (k−1)-th resin composition and the k-th resin composition are different from each other in photocuring ability due to the difference in the concentration of the polymerization inhibitor. When resin compositions having the same composition except for the concentration of a polymerization inhibitor are compared to each other, a resin composition having a higher concentration of the polymerization inhibitor usually has lower photocuring ability. Further, when resin compositions having the same composition except for the type of a polymerization inhibitor are compared to each other, a resin composition containing a polymerization inhibitor with a higher polymerization inhibiting ability (for example, a polymerization inhibitor capable of forming a more stable radical) usually has a lower photocuring ability.

In the first solder resist precursor layer formation process, as illustrated in FIG. 3, the first solder resist precursor layer 41 composed of the first resin composition is formed on the surface (2a) of the laminated base material 2 where the pad conductor layer 26 is formed. In this case, the first resin composition is prepared as a fluid containing the above-described solvent. The fluid is applied to the laminated base material 2 to form a coating film. Subsequently, the solvent is removed from the coating film by volatilization (that is, the coating film is dried). Thereby, the first solder resist precursor layer 41 can be formed. Further, it is also possible that the first solder resist precursor layer formation process is a process in which a first solder resist precursor layer 41 composed of the first resin composition prepared separately as a dry film is laminated on the laminated base material 2.

In the second solder resist precursor layer formation process (the k-th solder resist precursor layer formation process), as illustrated in FIG. 4, the second solder resist precursor layer 42 composed of the second resin composition is formed on the first solder resist precursor layer 41. In the second solder resist precursor layer formation process, the second resin composition is prepared as a fluid containing the above-described solvent. The fluid is applied to the first solder resist precursor layer 41 to form a coating film. Subsequently, the solvent is removed from the coating film by volatilization (that is, the coating film is dried). Thereby, the second solder resist precursor layer 42 can be formed. Further, it is also possible that the second solder resist precursor layer formation process is a process in which a second solder resist precursor layer 42 composed of the second resin composition prepared separately as a dry film is laminated on the first solder resist precursor layer 41.

In a more preferred embodiment, in the first solder resist precursor layer formation process and the second solder resist precursor layer formation process (the k-th solder resist precursor layer formation process), the first resin composition and the second resin composition (the k-th resin composition) are respectively prepared as fluids using the same solvent or mutually compatible solvents, and coating films of the fluids are respectively formed and dried according to the above-described procedures. According to this preferred embodiment, when the k-th solder resist precursor layer (for example, the second solder resist precursor layer 42) is formed, the solvent in the fluid containing the k-th resin composition leaches into the (k−1)-th solder resist precursor layer (for example, the first solder resist precursor layer 41), which is a lower layer, and a boundary portion of the (k−1)-th solder resist precursor layer is likely to be partially dissolved. In this preferred embodiment, mutual mixing of components occurs between the k-th solder resist precursor layer and the (k−1)-th solder resist precursor layer, and composition continuously varies between the two layers, and long with this, the photocuring ability is also likely to continuously vary.

The case where the number (n) of layers that form the solder resist precursor layer 40 is 2 is preferable in that the operation of the k-th solder resist precursor layer formation process is simple.

Figure 5:
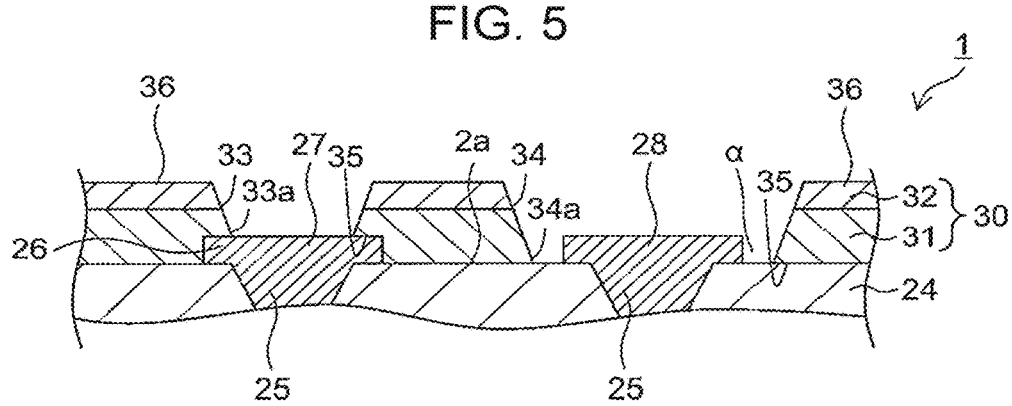
FIG. 5 is a schematic cross-sectional view near a surface of the printed wiring board 1 manufactured by the method for manufacturing the printed wiring board according to the embodiment of the present invention.

In the present embodiment, when n=2, in the first solder resist precursor layer formation process, the conductor pads (27, 28) are preferably covered by the first solder resist precursor layer 41. By adopting this structure, in a later-described exposure process, a portion of the solder resist layer 30 on the SMD pad 27 can also be sufficiently photocured. Therefore, formation of a recess in the laminated base material vicinity portion (33a) of the SMD opening 33 can be suppressed, and as illustrated in FIG. 5, the SMD opening 33 having an intended edge shape can be easily formed. Further, even in the case of forming the NSMD opening 34, an edge shape from the laminated base material vicinity portion (34a) of the NSMD opening 34 to an upper end of the NSMD opening 34 can be easily formed as intended. In this way, in the first solder resist precursor layer formation process, by allowing the conductor pads (27, 28) to be covered by the first solder resist precursor layer 41, in subsequent exposure process and developing process, in both the case of forming the SMD pad 27 and the SMD opening 33 and the case of forming the NSMD pad 28 and the NSMD opening 34, the edge shape of each of the openings of the solder resist layer 30 can be easily formed as intended.

In the present embodiment, when n=2, it is preferable that the first solder resist precursor layer 41 have a thickness of 5-45 μm. It is desirable that the second solder resist precursor layer 42 have a thickness of 5-25 μm. When the thicknesses of the first solder resist precursor layer 41 and the second solder resist precursor layer 42 are in the above-described ranges, a stable high photoreaction can be obtained, and by forming the layers to be thicker than the copper pad, the formation of a recess at the laminated base material vicinity portion (33a) of the SMD opening 33 due to dissolution of a low reaction cured portion that occurs during development can be suppressed. Further, when a thickness of a solder resist precursor layer composed of the first solder resist precursor layer and the second solder resist precursor layer is 100, the thickness of the first solder resist precursor layer can be 50-90. In the case of this ratio, the first solder resist precursor layer 41 can be easily formed to be thicker than the SMD pad 27, and the formation of a recess at the laminated base material vicinity portion (33a) of the SMD opening 33 due to dissolution of a low reaction cured portion that occurs during development can be suppressed.

In the present embodiment, the total thickness of the solder resist precursor layer 40 is not particularly limited, but may be in a range of 10-70 μm.

Exposure Process

Subsequently, the following exposure process is performed. The exposure process is a process in which the solder resist precursor layer 40 formed by the first solder resist precursor layer formation process and the second solder resist precursor layer formation process (the k-th solder resist precursor layer formation process) except for regions corresponding to the openings (33, 34) is irradiated with light and is cured. The exposure process can be typically performed by irradiating light to the solder resist precursor layer 40 in a state in which a light shielding mask that selectively shields the regions corresponding to the openings (33, 34) is formed on a surface of the solder resist precursor layer 40.

Conditions such as a wavelength of the light to be irradiated, light illuminance, and irradiation time in the exposure process can be suitably determined according to the first—n-th resin compositions that form the solder resist precursor layer 40. The light to be irradiated is ultraviolet light.

Developing Process

After the exposure process, a developing process is performed. The developing process is a process in which, after the exposure process, development is performed using a liquid developer to form the solder resist layer 30 in which the openings (33, 34) are formed (see FIG. 5).

As the liquid developer, a solvent in which an uncured portion of the solder resist precursor layer 40 is soluble and a photocured portion of the solder resist precursor layer 40 is insoluble can be used. An example of such a solvent is the same solvent as that used in forming the above-described fluid.

Other Processes

When the solder resist layer 30 obtained by the developing process can be further photocured, it is preferable that, after the developing process, a photocuring completion process be performed in which light irradiation is further performed to complete the photocuring.

Further, when the solder resist layer 30 obtained by the developing process contains thermosetting resin, it is preferable that, after the developing process, a thermal curing process be performed in which the solder resist layer 30 is thermally cured.

Further, the solder bumps (S1, S2) can be respectively provided on the conductor pads (27, 28) surrounded by the openings (33, 34). In this case, before the solder bumps (S1, S2) are provided, a surface treatment layer (not illustrated in the drawings) for preventing oxidation may be provided on a surface of each of the conductor pads (27, 28). By providing the surface treatment layer on the surface of each of the conductor pads (27, 28), oxidation of the conductor pads (27, 28) before the formation of the solder bumps can be prevented and adhesion of solder to the conductor pads (27, 28) can be improved. Examples of the surface treatment layer include plating films such as a nickel-gold plating film, a nickel-palladium-gold plating film and a tin plating film, and an OSP (organic solderability preservative) film (preflux film), and the like.

Printed Wiring Board

In the printed wiring board 1 of the present embodiment, the solder resist layer 30 is a layer that contains chemical species derived from photopolymerization initiators, and satisfies at least one of the following conditions:

(1) concentration of a chemical species derived from a photopolymerization initiator in a portion 35 of the solder resist layer 30 in contact with the laminated base material 2 is higher than concentration of a chemical species derived from a photopolymerization initiator in a surface portion 36 of the solder resist layer 30; and (2) the chemical species derived from the photopolymerization initiator contained in the portion 35 of the solder resist layer 30 in contact with the laminated base material 2 is a chemical species derived from a photopolymerization initiator that has a higher photopolymerization initiating ability than the chemical species derived from the photopolymerization initiator contained in the surface portion 36 of the solder resist layer 30.

In the printed wiring board 1 of the present embodiment, more preferably, the solder resist layer 30 further includes chemical species derived from polymerization inhibitors, and satisfies at least one of the following conditions:

(3) concentration of a chemical species derived from a polymerization inhibitor in the surface portion 36 of the solder resist layer 30 is higher than concentration of a chemical species derived from a polymerization inhibitor in the portion 35 of the solder resist layer 30 in contact with the laminated base material 2; and (4) the chemical species derived from the polymerization inhibitor contained in the surface portion 36 of the solder resist layer 30 is a chemical species derived from a polymerization inhibitor that has a higher polymerization inhibiting ability than the chemical species derived from the polymerization inhibitor contained in the portion 35 of the solder resist layer 30 in contact with the laminated base material 2.

In the printed wiring board 1 of the present embodiment satisfying one or both of the conditions (1) and (2), and further, in the printed wiring board 1 of the present embodiment satisfying one or both of the conditions (3) and (4), the solder resist layer 30 can be sufficiently cured from the surface portion 36 to the portion 35 in contact with the laminated base material 2. The laminated base material vicinity portions (33a, 34a) of the openings (33, 34) have the intended shapes. Therefore, a short circuit between adjacent conductor pads (27, 28) is unlikely to occur. Further, haloing of the solder resist layer 30 is also unlikely to occur.

The printed wiring board 1 of the present embodiment can be manufactured using the method for manufacturing a printed wiring board of the embodiment that is described above in detail.

As the photopolymerization initiators and the polymerization inhibitors, the photopolymerization initiators and the polymerization inhibitors that are described with respect to the method for manufacturing a printed wiring board can be used.

Examples of chemical species derived from photopolymerization initiators include radical active species generated by irradiating light to photopolymerization initiators in the exposure process, groups generated by reactions of radical active species and a photosensitive resin or other components in a photosensitive resin composition, and the like.

Examples of chemical species derived from polymerization inhibitors include groups generated by reactions between polymerization inhibitors and radical active species in the exposure process, and the like.

The printed wiring board 1 of the present embodiment may include the SMD pad 27, or the NSMD pad 28, or, as illustrated in FIG. 1, both the SMD pad 27 and the NSMD pad 28, as conductor pads.

When the printed wiring board 1 includes the SMD pad 27, the portion 35 of the solder resist layer 30 in contact with the laminated base material 2 refers to a portion of the solder resist layer 30 on the SMD pad 27. When the printed wiring board 1 includes the NSMD pad 28, the portion 35 of the solder resist layer 30 in contact with the laminated base material 2 refers to a portion of the solder resist layer 30 in contact with an outermost interlayer insulating layer (the second insulating layer 24) of the laminated base material 2.

One of methods for forming a solder resist layer in a printed wiring board is a method in which a layer of a resin composition (hereinafter, may be referred to as a "photosensitive resin composition") that contains a photosensitive resin, a photopolymerization initiator, and, when necessary, other components is formed by irradiating ultraviolet light or the like to the layer to cure the layer. For example, Japanese Patent Laid-Open Publication No. 2001-19865 describes that a solder resist resin composition that contains photosensitizied oligomer obtained by acrylating 50% of epoxy groups of a cresol binolac type epoxy resin (which is a photosensitive resin), benzophenone (which is a photopolymerization initiator) and other components is applied to a surface of a laminated base material to form a layer having a thickness of 20 μm, and thereafter, a photomask on which a pattern of openings is drawn is brought into close contact with the layer and exposure is performed by irradiating ultraviolet light to the layer, and diethylene glycol dimethyl ether is used as a liquid developer to perform development to form the openings, and after the development, a heat treatment is further performed, and thereby a solder resist layer having openings for solder pads is formed.

Figure 6:
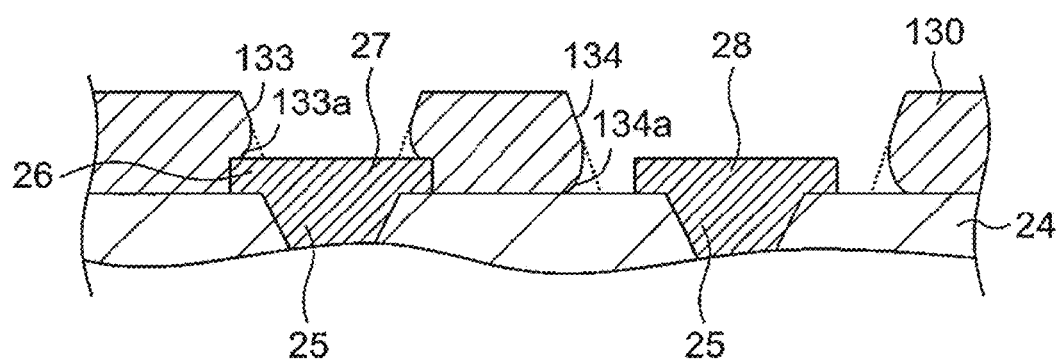
FIG. 6 is a schematic cross-sectional view (1) for describing a problem that is thought to occur in a conventional method for manufacturing a printed wiring board.

When a solder resist layer is formed on a laminated base material for manufacturing a printed wiring board, when a solder resist precursor layer composed of a photosensitive resin composition that has substantially uniform composition in a thickness direction is formed and exposed, depending on a condition, although a surface portion of the solder resist layer is sufficiently photocured, it is possible that a laminated base material vicinity portion is not sufficiently photocured. Then, when the photocuring of the laminated base material vicinity portion of the solder resist layer is insufficient, after the exposure, when an unexposed region is removed using a liquid developer to form an opening, a laminated base material vicinity portion of an edge of the opening is removed and there is a possibility that the edge of the opening does not have an intended shape. For example, FIG. 6 schematically illustrates a case where, on a surface of a laminated base material 2, a solder resist layer 130 is formed using a photosensitive resin composition that has a substantially uniform composition in the thickness direction, and openings (133, 134) are formed by exposure and development. It is thought that, even when exposure is performed with an intention to allow laminated base material vicinity portions (133a, 134a) of the openings (133, 134) to have shapes indicated by dotted lines, there is a possibility that light with sufficient illumination does not reach a portion of the solder resist layer 130 near the laminated base material 2 and photocuring of the photosensitive resin composition is insufficient. It is thought that, when the photocuring of the portion of the solder resist layer 130 near the laminated base material 2 is insufficient, when the openings (133, 134) are formed by development using a liquid developer, the laminated base material vicinity portions (133a, 134a) are removed by the liquid developer, and as illustrated in FIG. 6, recesses can occur.

One aspect of the present invention relates to a printed wiring board, which includes a laminated base material that includes one or more conductor layers and one or more insulating layers, and a solder resist layer that is laminated on at least one of surfaces of the laminated base material. The laminated base material includes, as at least a part of the conductor layers, a pad conductor layer that has a pattern including a conductor pad on a surface in contact with the solder resist layer. An opening is provided in the solder resist layer. The conductor pad is positioned in the opening. The solder resist layer is a layer that contains chemical species derived from photopolymerization initiators, and satisfies at least one of the following conditions:

(1) concentration of a chemical species derived from a photopolymerization initiator in a portion of the solder resist layer in contact with the laminated base material is higher than concentration of a chemical species derived from a photopolymerization initiator in a surface portion of the solder resist layer; and (2) the chemical species derived from the photopolymerization initiator contained in the portion of the solder resist layer in contact with the laminated base material is a chemical species derived from a photopolymerization initiator that has a higher photopolymerization initiating ability than the chemical species derived from the photopolymerization initiator contained in the surface portion of the solder resist layer.

Another aspect of the present invention relates to a method for manufacturing a printed wiring board. The printed wiring board includes a laminated base material that includes one or more conductor layers and one or more insulating layers, and a solder resist layer that is laminated on at least one of surfaces of the laminated base material. The laminated base material includes, as at least a part of the conductor layers, a pad conductor layer that has a pattern including a conductor pad on a surface in contact with the solder resist layer. An opening is provided in the solder resist layer. The conductor pad is positioned in the opening. The method for manufacturing the printed wiring board includes: a first solder resist precursor layer formation process in which, on a surface of the laminated base material where the pad conductor layer is formed, a first solder resist precursor layer composed of a first resin composition that contains a photosensitive resin and a photopolymerization initiator is formed; a k-th solder resist precursor layer formation process, in which a process, in which, on a (k−1)-th solder resist precursor layer, a k-th solder resist precursor layer composed of a k-th resin composition that contains a photosensitive resin and a photopolymerization initiator is formed, is performed from k=2 to k=n (where n is an integer equal to or greater than 2); an exposure process in which the solder resist precursor layers from the first solder resist precursor layer to the n-th solder resist precursor layer that are formed by the first solder resist precursor layer formation process and the k-th solder resist precursor layer formation process, except for a region corresponding to the opening, are irradiated with light and are cured; and a developing process in which, after the exposure process, development is performed using a liquid developer, and the solder resist layer is formed in which the opening is formed. A photocuring ability of the (k−1)-th resin composition is the same as or higher than a photocuring ability of the k-th resin composition, and the photocuring ability of the first resin composition is higher than the photocuring ability of the n-th resin composition.

In a printed wiring board according to an embodiment of the present invention, the solder resist layer is sufficiently cured from a surface portion to a portion in contact with the laminated base material, and the opening of the solder resist layer has an intended shape. As a result, a short circuit between adjacent conductor pads is unlikely to occur. Further, haloing of the solder resist layer is unlikely to occur.

In a method for manufacturing a printed wiring board according to an embodiment of the present invention, the printed wiring board can be manufactured in which the solder resist layer is sufficiently cured from a surface portion to a portion in contact with the laminated base material.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a laminated base material comprising an insulating layer and a pad conductor layer formed on the insulating layer;
   a first solder resist layer laminated on a surface of the laminated base material and comprising a photosensitive resin material; and
   a second solder resist layer comprising a photosensitive resin material and forming a surface portion such that the first solder resist layer is forming a portion in contact with the laminated base material on an opposite side with respect to the surface portion,
   wherein the pad conductor layer of the laminated base material has a pattern including a plurality of conductor pads in contact with the first solder resist layer such that the conductor pads are positioned in opening portions formed in the first and second solder resist layers, respectively, and the first and second solder resist layers satisfy at least one of a first condition that a chemical species derived from a photopolymerization initiator has a concentration that is higher in the first solder resist layer than a concentration in the second solder resist layer and a second condition that the chemical species derived from the photopolymerization initiator in the first solder resist layer has photopolymerization initiating ability higher than a chemical species derived from a photopolymerization initiator in the second solder resist layer.

2. A printed wiring board according to claim 1, wherein the first and second solder resist layers satisfy at least one of the first and second conditions and at least one of a third condition that a chemical species derived from a photopolymerization inhibitor has a concentration that is higher in the second solder resist layer than a concentration in the first solder resist layer and a fourth condition that the chemical species derived from the photopolymerization inhibitor in the second solder resist layer has photopolymerization inhibiting ability higher than a chemical species derived from a photopolymerization inhibitor in the first solder resist layer.

3. A printed wiring board according to claim 2, wherein the plurality of conductor pads includes at least one solder mask defined conductor pad having a portion that is extending between the solder resist layer and the insulating layer at an edge of a respective one of the opening portions.

4. A printed wiring board according to claim 2, wherein the plurality of conductor pads includes at least one non solder mask defined conductor pad formed inside a respective one of the opening portions such that the non solder mask defined conductor pad has a space formed between an edge of the respective one of the opening portions and the non solder mask defined conductor pad.

5. A printed wiring board according to claim 1, wherein the plurality of conductor pads includes at least one solder mask defined conductor pad having a portion that is extending between the solder resist layer and the insulating layer at an edge of a respective one of the opening portions.

6. A printed wiring board according to claim 5, wherein the plurality of conductor pads includes at least one non solder mask defined conductor pad formed inside a respective one of the opening portions such that the non solder mask defined conductor pad has a space formed between an edge of the respective one of the opening portions and the non solder mask defined conductor pad.

7. A printed wiring board according to claim 1, wherein the plurality of conductor pads includes at least one non solder mask defined conductor pad formed inside a respective one of the opening portions such that the non solder mask defined conductor pad has a space formed between an edge of the respective one of the opening portions and the non solder mask defined conductor pad.

8. A method for manufacturing a printed wiring board, comprising:
   forming, on a surface of a laminated base material comprising a pad conductor layer, a plurality of solder resist precursor layers such that the plurality of solder resist precursor layers includes a first solder resist precursor layer formed on the surface of the laminated base material and comprising a first resin composition including a photosensitive resin material and a photopolymerization initiator and that the plurality of solder resist precursor layers includes a second solder resist precursor layer forming a surface portion and comprising a second resin composition including a photosensitive resin material and a photopolymerization initiator;
   irradiating light upon the plurality of solder resist precursor layers except for regions corresponding to a plurality of opening portions such that the plurality of solder resist precursor layers from the first solder resist precursor layer to the second solder resist precursor layer is cured; and
   developing the plurality of solder resist precursor layers with a liquid developer such that first and second solder resist layers having the plurality of opening portions exposing a plurality of conductor pads of the pad conductor layer is formed,
   wherein the laminated base material includes an insulating layer and the pad conductor layer formed on the insulating layer, and the first and second solder resist layers satisfy at least one of a first condition that a chemical species derived from a photopolymerization initiator has a concentration that is higher in the first solder resist layer than a concentration in the second solder resist layer and a second condition that the chemical species derived from the photopolymerization initiator in the first solder resist layer has photopolymerization initiating ability higher than a chemical species derived from a photopolymerization initiator in the second solder resist layer.

9. A method for manufacturing a printed wiring board according to claim 8, wherein the plurality of solder resist precursor layers includes the photopolymerization initiator in different concentrations in different solder resist precursor layers, different photopolymerization initiators in different solder resist precursor layers, or a combination thereof.

10. A method for manufacturing a printed wiring board according to claim 9, wherein the plurality of solder resist precursor layers includes a photopolymerization inhibitor in different concentrations in different solder resist precursor layers, different photopolymerization inhibitors in different solder resist precursor layers, or a combination thereof.

11. A method for manufacturing a printed wiring board according to claim 9, wherein the plurality of conductor pads includes at least one solder mask defined conductor pad having a portion that is extending between the solder resist layer and the insulating layer at an edge of a respective one of the opening portions.

12. A method for manufacturing a printed wiring board according to claim 9, wherein the plurality of conductor pads includes at least one non solder mask defined conductor pad formed inside a respective one of the opening portions such that the non solder mask defined conductor pad has a space formed between an edge of the respective one of the opening portions and the non solder mask defined conductor pad.

13. A method for manufacturing a printed wiring board according to claim 9, wherein the forming of the solder resist precursor layers comprises forming, on the surface of the laminated base material, the first solder resist precursor layer such that the first solder resist precursor layer covers the plurality of conductor pads.

14. A method for manufacturing a printed wiring board according to claim 9, wherein the forming of the solder resist precursor layers comprises forming, on the surface of the laminated base material, the first solder resist precursor layer, and forming the second solder resist precursor layer on the first solder resist precursor layer such that the first solder resist precursor layer has a thickness in a range of 50 to 90 in a ratio with respect to a thickness of the solder resist precursor layers comprising the first and second solder resist precursor layers being 100.

15. A method for manufacturing a printed wiring board according to claim 8, wherein the plurality of solder resist precursor layers includes a photopolymerization inhibitor in different concentrations in different solder resist precursor layers, different photopolymerization inhibitors in different solder resist precursor layers, or a combination thereof.

16. A method for manufacturing a printed wiring board according to claim 8, wherein the plurality of conductor pads includes at least one solder mask defined conductor pad having a portion that is extending between the solder resist layer and the insulating layer at an edge of a respective one of the opening portions.

17. A method for manufacturing a printed wiring board according to claim 16, wherein the plurality of conductor pads includes at least one non solder mask defined conductor pad formed inside a respective one of the opening portions such that the non solder mask defined conductor pad has a space formed between an edge of the respective one of the opening portions and the non solder mask defined conductor pad.

18. A method for manufacturing a printed wiring board according to claim 8, wherein the plurality of conductor pads includes at least one non solder mask defined conductor pad formed inside a respective one of the opening portions such that the non solder mask defined conductor pad has a space formed between an edge of the respective one of the opening portions and the non solder mask defined conductor pad.

19. A method for manufacturing a printed wiring board according to claim 8, wherein the forming of the solder resist precursor layers comprises forming, on the surface of the laminated base material, the first solder resist precursor layer such that the first solder resist precursor layer covers the plurality of conductor pads.

20. A method for manufacturing a printed wiring board according to claim 8, wherein the forming of the solder resist precursor layers comprises forming, on the surface of the laminated base material, the first solder resist precursor layer, and forming the second solder resist precursor layer on the first solder resist precursor layer such that the first solder resist precursor layer has a thickness in a range of 50 to 90 in a ratio with respect to a thickness of the solder resist precursor layers comprising the first and second solder resist precursor layers being 100.

* * * * *